(12) United States Patent
Watanabe

(10) Patent No.: US 8,445,972 B2
(45) Date of Patent: May 21, 2013

(54) SEMICONDUCTOR DEVICE WITH RECONFIGURABLE LOGIC

(75) Inventor: Yoshiharu Watanabe, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 265 days.

(21) Appl. No.: 11/394,515

(22) Filed: Mar. 31, 2006

(65) Prior Publication Data
US 2006/0237773 A1    Oct. 26, 2006

Related U.S. Application Data

(63) Continuation of application No. PCT/JP2005/006267, filed on Mar. 31, 2005.

(51) Int. Cl.
*H01L 27/088* (2006.01)

(52) U.S. Cl.
USPC ........... 257/401; 326/44; 326/49; 365/189.09

(58) Field of Classification Search
USPC .................... 257/401, 324, E21.688; 326/44, 326/49; 365/189.09
See application file for complete search history.

(56) References Cited

U.S. PATENT DOCUMENTS

| | | | |
|---|---|---|---|
| 4,287,571 A | | 9/1981 | Chakravarti et al. |
| 5,040,035 A | * | 8/1991 | Gabara et al. ................. 257/401 |
| 5,444,275 A | * | 8/1995 | Kugishima et al. ........... 257/206 |
| 5,686,336 A | * | 11/1997 | Lee ................................ 438/238 |
| 5,847,993 A | * | 12/1998 | Dejenfelt ................... 365/185.1 |
| 5,900,661 A | * | 5/1999 | Sato ............................... 257/315 |
| 5,965,925 A | * | 10/1999 | Kornachuk et al. ........... 257/401 |
| 6,011,725 A | * | 1/2000 | Eitan ........................ 365/185.33 |
| 6,072,720 A | * | 6/2000 | Peng et al. ................ 365/185.05 |
| 6,262,911 B1 | * | 7/2001 | Braceras et al. .............. 365/154 |

(Continued)

FOREIGN PATENT DOCUMENTS

| | | |
|---|---|---|
| EP | 0 025 130 | 3/1981 |
| JP | 56-040274 | 4/1981 |

(Continued)

OTHER PUBLICATIONS

Mavis, D et al., "A Reconfigurable, Nonvolatile, Radiation Hardened Field Programmable Gate Array (FPGA) for Space Applications", Proc. 1998. NASA MAPLD Conf.*

(Continued)

*Primary Examiner* — Matthew Landau
*Assistant Examiner* — Sun M Kim

(57) ABSTRACT

A semiconductor device includes multiple transistors (70, 75, 80, 85), each of the transistors (70, 75, 80, 85) including a gate electrode (18) formed above a semiconductor substrate (30), source/drain regions (10, 12, 14, 16) formed on both sides of the gate electrode (18), and a charge storage layer (38) interposed between the gate electrode (18) and the semiconductor substrate (30). One of the source/drain regions (10, 12, 14, 16) of adjacent transistors (70, 75, 80, 85) is respectively connected in series, so the above-mentioned multiple transistors (70, 75, 80, 85) form a closed loop in the semiconductor device. Accordingly, it is possible to provide a semiconductor device (60) in which the circuit function of the logic circuit (64) can be reconfigured in a non-volatile manner, thereby enabling wide selectivity and excellent design facility in terms of the circuit design and making it possible to readily fabricate the logic circuit (64) and a non-volatile memory (62) on a single chip (60).

12 Claims, 13 Drawing Sheets

U.S. PATENT DOCUMENTS

| | | | |
|---|---|---|---|
| 6,459,118 B1 * | 10/2002 | Kang | 257/310 |
| 6,566,710 B1 * | 5/2003 | Strachan et al. | 257/341 |
| 6,601,224 B1 * | 7/2003 | Kiss et al. | 716/8 |
| 6,946,706 B1 * | 9/2005 | Brisbin et al. | 257/343 |
| 6,963,103 B2 * | 11/2005 | Forbes | 365/185.08 |
| 7,015,097 B2 * | 3/2006 | Lee et al. | 257/E21.688 |

FOREIGN PATENT DOCUMENTS

| | | |
|---|---|---|
| JP | 9-116122 | 5/1997 |
| JP | 09-116122 * | 5/1997 |
| JP | 2001-512290 T | 8/2001 |
| WO | WO/99/07000 | 2/1999 |

OTHER PUBLICATIONS

Ng, Kwok, "Complete Guide to Semiconductor Devices", John Wiley & Sons, New York, © 2002, pp. 357-358.*

* cited by examiner

SEMICONDUCTOR DEVICE WITH RECONFIGURABLE LOGIC

CROSS-REFERENCES TO RELATED APPLICATIONS

This is a continuation of International Application No. PCT/JP2005/006267, filed Mar. 31, 2005 which was not published in English under PCT Article 21(2).

BACKGROUND OF THE INVENTION

1. Field of the Invention

This invention generally relates to semiconductors having logic circuit functionality and, more particularly, to a semiconductor device whose logical function can be reconfigured.

2. Description of the Related Art

Many logic circuits are for use in products having a short product development cycle (e.g., mobile devices such as mobile telephones) because the function of many logic circuits can be reconfigured by means of programming and the cycle of circuit design for such logic circuits can be shortened. As a reconfigurable logic circuit, for example, Field Programmable Gate Arrays (FPGAs) may be employed. FPGAs utilize static random access memory (SRAM) for programming and anti-fuse technology wherein an anti-fuse becomes conductive after it is programmed.

On the other hand, flash memories are widely used as a non-volatile memory. There are flash memories having an Oxide/Nitride/Oxide (ONO) film such as MONOS (Metal Oxide Nitride Oxide Silicon) type or SONOS (Silicon Oxide Nitride Oxide Silicon) type. In these types of flash memories, the charge is stored in the silicon nitride layer, known as a trapping layer, which is sandwiched between the silicon oxide layers. Flash memory having the ONO film is disclosed in, for example, U.S. Pat. No. 6,011,725 (hereinafter, referred to as Patent Document 1). In flash memory having an ONO film, data is written by storing the charge in the ONO film. Such stored charge changes the threshold voltage of the transistor in a non-volatile manner. Data is read by reading the threshold voltage. Also, data is erased by extracting the stored charge.

With respect to conventional FPGAs, however, while SRAM is programmable any number of times, it is volatile. In contrast, the anti-fuse is non-volatile, yet it is programmable only once. In addition, it is difficult to satisfy both the wide selectivity and design efficiency in terms of circuit design. Further, the fabrication process is complicated if the FPGA logic circuit and the non-volatile memory are fabricated on a single chip.

SUMMARY OF THE INVENTION

The present invention has been made to overcome the above drawbacks of the prior art and has an object to provide a semiconductor device which is a logic circuit wherein the logical function can be reconfigured in a non-volatile manner with both wide selectivity and excellent design efficiency in terms of circuit design, and wherein a non-volatile memory can be fabricated on a same semiconductor chip.

According to an aspect of the present invention, preferably, there is provided a semiconductor device having a transistor including a gate electrode formed above a semiconductor substrate, source/drain regions formed on both sides of the gate electrode, and a charge storage layer interposed between the gate electrode and the semiconductor substrate, the transistor including the gate electrode, the source/drain regions and the charge storage layer and the transistor having a logical function that can be reconfigured in a non-volatile manner by storing a charge in the charge storage layer. According to the present invention, the charge is stored in the charge storage layer and the threshold voltage of the transistor is changed in a non-volatile manner, thus enabling a logic circuit in which the circuit function is reconfigurable in a non-volatile manner.

According to another aspect of the present invention, preferably, there is provided a semiconductor device having transistors. Each of the transistors may have a gate electrode formed above a semiconductor substrate, source/drain regions formed on both sides of the gate electrode, and a charge storage layer interposed between the gate electrode and the semiconductor substrate, the source/drain regions of the transistors connected so as to form a closed loop. According to the present invention, the charge is stored in the charge storage layer and the threshold voltage of the transistor is changed in a non-volatile manner, thus enabling a logic circuit in which the circuit function is reconfigurable in a non-volatile manner. In addition, a basic block of the logic circuit is configured to have the reconfiguration function of the circuit and the basic block is repeatedly located, thereby enabling the wide selectivity and excellent design efficiency in terms of the circuit design. Further, the logic circuit can be fabricated in the same fabrication process as that of a non-volatile memory, allowing the logic circuit to be fabricated on the same chip as the non-volatile memory.

According to yet another aspect of the present invention, preferably, there is provided a semiconductor device including a logic circuit having the above-mentioned transistor and a memory array having a non-volatile memory.

According to still another aspect of the present invention, preferably, there is provided a semiconductor device including a logic circuit having the above-mentioned transistors and a memory array having a non-volatile memory.

DESCRIPTION OF THE PREFERRED EMBODIMENTS

A description will now be given, with reference to the accompanying drawings, of embodiments of the present invention.

First Embodiment

Figure 1:
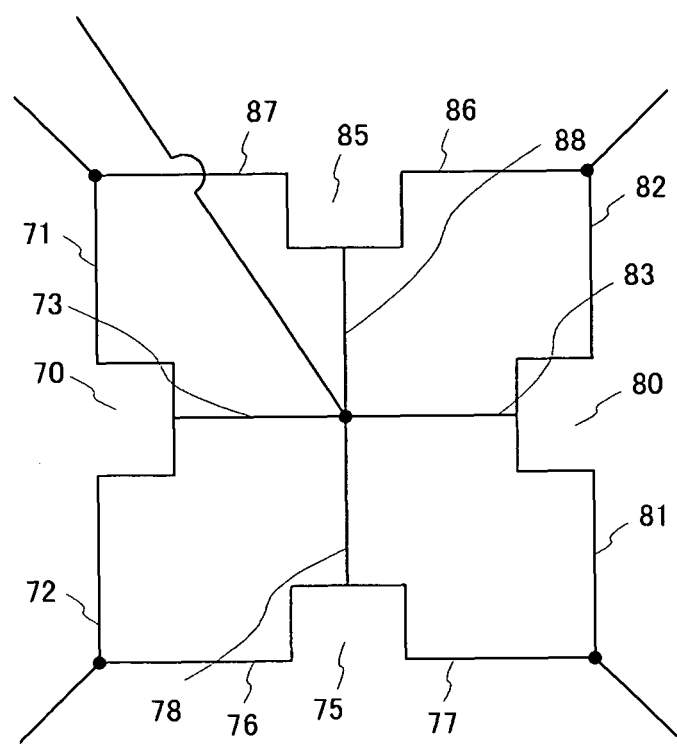
FIG. 1 is a view showing a circuit configuration of a circuit in accordance with a first embodiment of the present invention.

FIG. 1 shows a circuit of a four-FET memory cell in accordance with a first embodiment of the present invention. The cell includes FET1(70), FET2(75), FET3(80), and FET4(85). A second source/drain region 72 of FET1(70) and a first source/drain region 76 of FET2(75), a second source/drain region 77 of FET2(75) and a first source/drain region 81 of FET3(80), a second source/drain region 82 of FET3(80) and a first source/drain region 86 of FET4(85), and a second source/drain region 87 of FET4(85) and a first source/drain region 71 of FET1(70) are respectively connected. That is to say, adjacent source/drain regions are connected in series to form a closed loop. In other words, source/drain regions in adjoining transistors are respectively connected and a closed loop is formed with four transistors (70, 75, 80, and 85). In addition, gates 73, 78, 83, and 88 of FET1(70), FET2(75), FET3(80), and FET4(85) are connected together.

Figure 2:
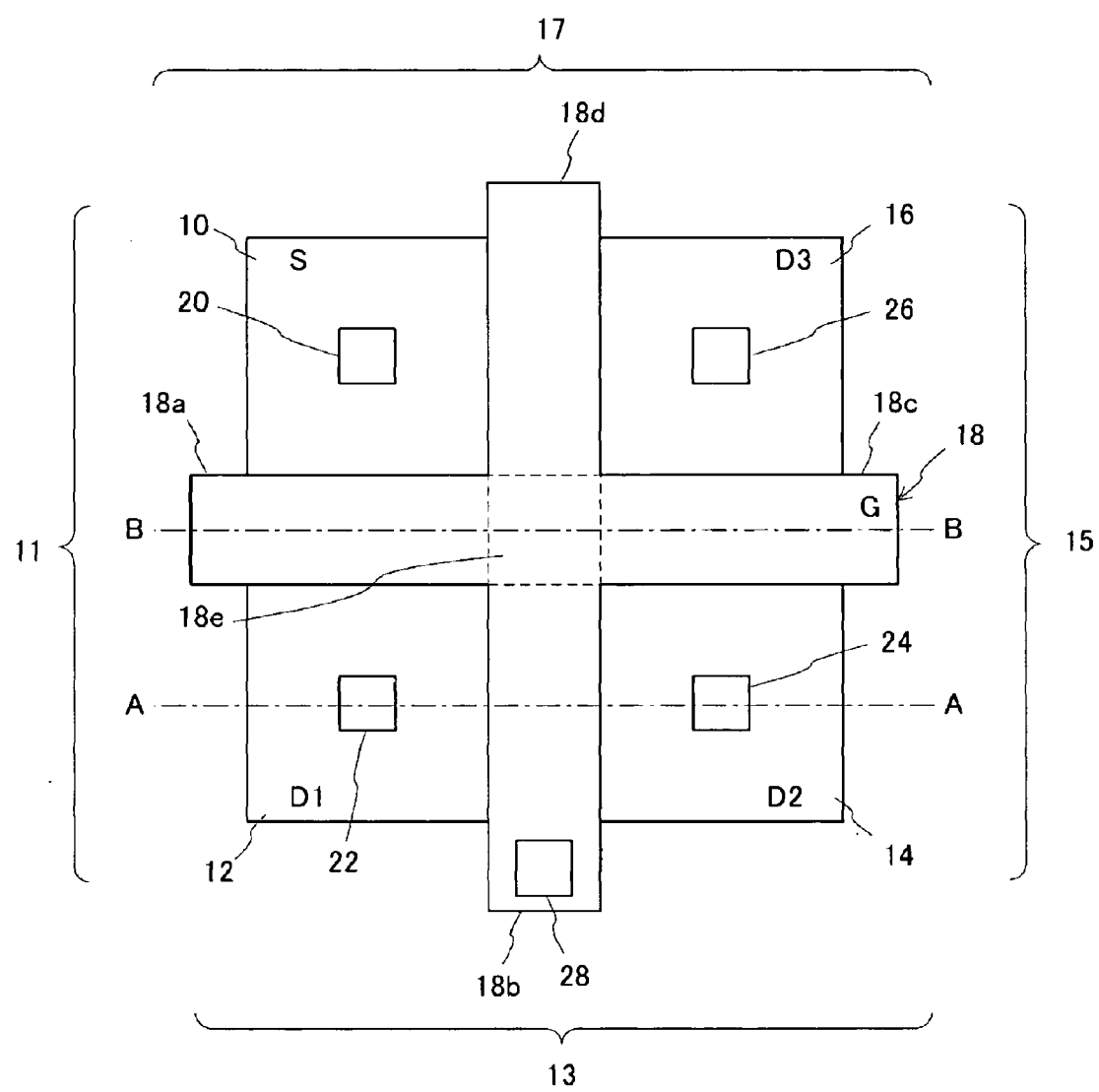
FIG. 2 is a top view of the circuit in accordance with the first embodiment of the present invention.
Figure 3:
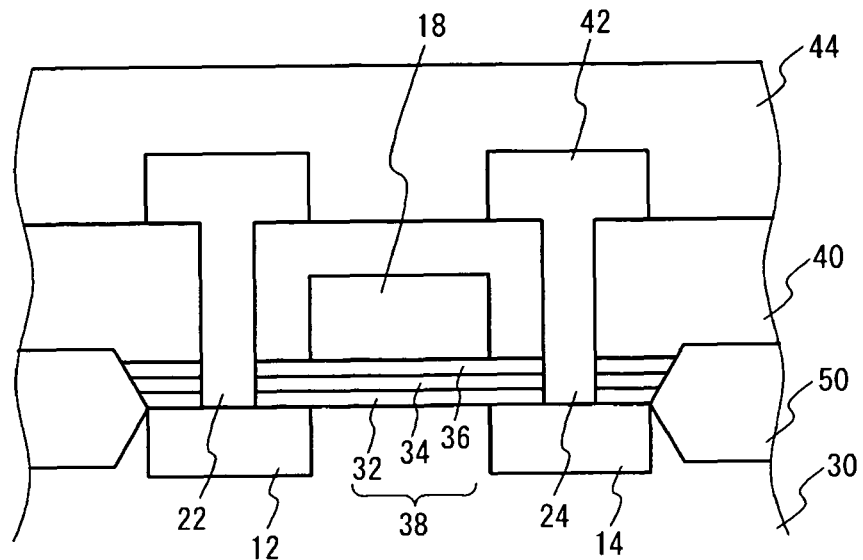
FIG. 3 is a cross-sectional view of the circuit in accordance with the first embodiment of the present invention, taken along a line A-A shown in FIG. 2.
Figure 4:
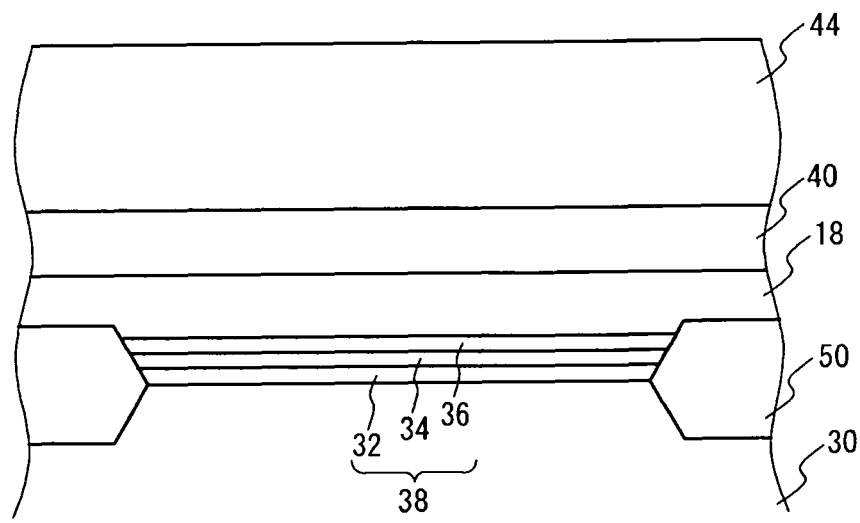
FIG. 4 is a cross-sectional view of the circuit in accordance with the first embodiment of the present invention, taken along a line B-B shown in FIG. 2.

Next, a description will be given of a fabrication method, with reference to FIGS. 2, 3, and 4, showing an exemplary fabrication method for a memory cell in accordance with the first embodiment of the present invention. FIG. 2 is a top view of the cell in accordance with the first embodiment (a protection film 44, an interconnection layer 42, and an interlayer insulating film 40 are not shown). FIG. 3 is a cross-sectional view taken along a line A-A shown in FIG. 2. FIG. 4 is a cross-sectional view taken along a line B-B shown in FIG. 2. Referring to FIG. 3, a formed or embedded oxide film 50 is provided for element isolation in a given region of a P-type silicon semiconductor substrate 30 (or in a P-type region in the silicon substrate), by using Shallow Trench Isolation (STI), for example. LOCOS processing may be used. A silicon oxide film (tunnel oxide film) 32, a silicon nitride film (trapping layer) 34, and a silicon oxide film (top oxide film) 36 are deposited on a semiconductor substrate 30 as an ONO film 38.

Arsenic ions, for example, are implanted into the semiconductor substrate 30 to form the soured/drain regions. Here, S(10), D1(12), S2(14), and D3(16) respectively represent a region common to the second source/drain region of FET4 (17) and the first source/drain region of FET1(11), a region common to the second source/drain region of FET1(11) and the first source/drain region of FET2(13), a region common to the second source/drain region of FET2(13) and the first source/drain region of FET3(15), and a region common to the second source/drain region of FET3(15) and the first source/drain region of FET4(17). The source/drain regions in adjacent transistors are configured to be common, thereby enabling the chip area of the circuit to be downsized.

The ONO film 38 (the silicon oxide film 32, the silicon nitride film 34, and the silicon oxide film 36) is deposited by thermal oxidation or chemical vapor deposition (CVD) on the semiconductor substrate 30 as a charge storage layer. A polysilicon film is formed on the ONO film 38 and a given region is etched. Thus, there is provided a gate electrode (G1) 18a of FET1(11), a gate electrode (G2) 18b of FET2(13), a gate electrode (G3) 18c of FET3(15), a gate electrode (G4) 18d of FET4(17), and a connecting portion 18e of the gate electrodes. The gate electrodes 18a, 18b, 18c, and 18d are connected at the center of the respective FETs (i.e., the center of the memory cell) by the connecting portion 18e. This makes it possible to downsize the chip area of the circuit.

A silicon oxide film is formed as the interlayer insulating film 40, and contact holes 20, 22, 24, 26, and 28 are formed in the interlayer insulating film 40 and in the ONO film 38. For example, TiN or W is buried in the contact holes 20, 22, 24, 26, and 28 and the interconnection layer 42 of Al is formed thereon. In this manner, S(10), D1(12), D2(14), D3(16), and a gate electrode 18 are respectively connected to the interconnection layer 42. A protection film 44 is then deposited on the interlayer insulating film 40 and the interconnection layer 42.

With the use of the fabrication method of the cell in accordance with the first embodiment as shown in FIG. 2, a non-volatile memory, such as that described in Patent Document 1, can be fabricated by configuring the gate electrode 18 to serve as the word line, the source/drain regions 10, 12, 14, and 16 to serve as the bit lines, and the ONO film 38 to serve as the charge storage layer. In this case, it is possible to use the ONO film 38 serving as the charge storage layer in accordance with the first embodiment, as the charge storage layer in a non-volatile memory, with the same configuration.

The cell fabricated as described heretofore includes the gate electrode 18 formed above the semiconductor substrate 30, the source/drain regions formed on both sides of the gate electrode, and FET1(11), FET2(13), FET3(15), and FET4 (17) having the charge storage layer (the ONO film 38) interposed between the gate electrode 18 and the semiconductor substrate 30. One of the source/drain regions in each of the adjacent transistors (FETs) is respectively connected in series, and the four transistors (FETs) form a closed loop.

The above-mentioned transistor (FET) is capable of changing the threshold voltage in a non-volatile manner by storing the charge in the ONO film 38. First, the threshold voltage of the FET in which the charge is not stored in the ONO film 38 can be controlled by an acceptor concentration of the P-type semiconductor substrate 30 or gate length. The threshold voltage of the FET is increased in a non-volatile manner when the charge is stored in the ONO film 38. The amount of change in the threshold voltage can be controlled by controlling the amount of charge stored in the ONO film 38 in each FET. This makes it possible to separately control the threshold voltages of the FETs in a non-volatile manner thus enabling the circuit function to be reconfigured in a non-volatile manner.

A description will now be provided of a reconfiguration operation for the circuit function of the cell in accordance with the first embodiment.

Figure 5:
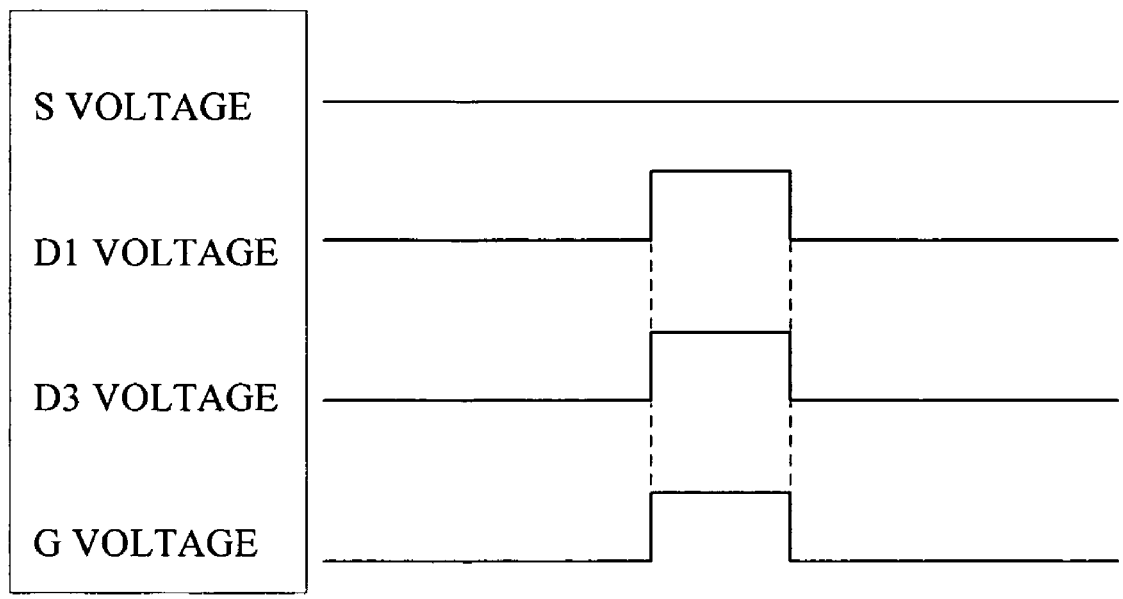
FIG. 5 is a timing chart of a case where an OR circuit function is to be programmed in the circuit in accordance with the first embodiment of the present invention.

First, FIG. 5 is a timing chart showing a case where OR circuit functions are programmed. 10 V, for example, is applied to D1(12) and D3(16), with S(10) grounded and 12 V, for example, applied to the gate electrode. This injects hot electrons that become high energy electrons in the channels below the gates G1(18a) and G4(18d) into the ONO film 38 (charge storage layer) below the gates G1(18a) and G4(18d) so that the charge is stored. The threshold voltages of FET1 (11) and FET4(17) are increased. The threshold voltage can be controlled by a period and a voltage while the voltage is being applied to D1(12) and D3(16).

Figure 6:
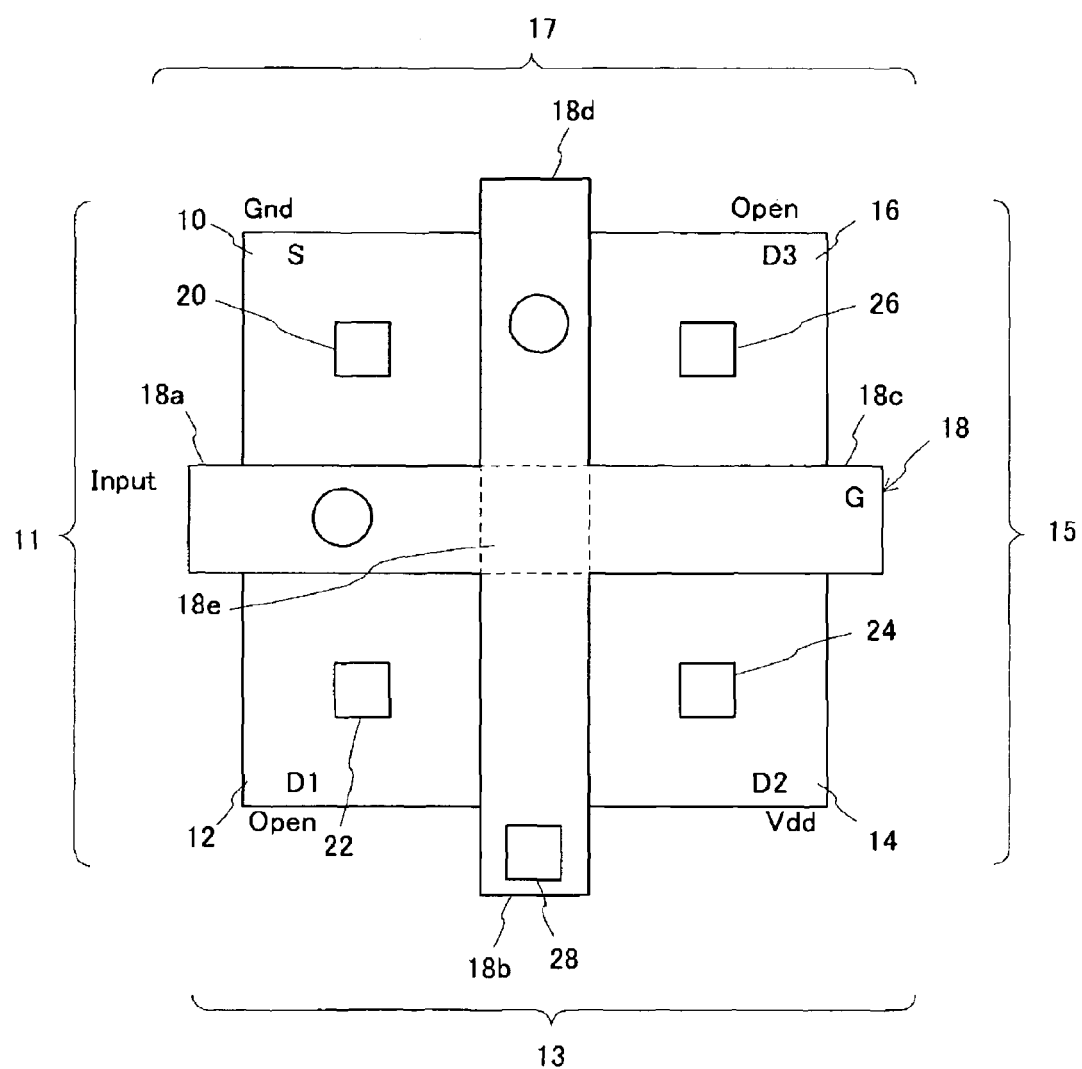
FIG. 6 is a top view illustrating the function when the OR circuit function is programmed in the circuit in accordance with the first embodiment of the present invention.

As shown in FIG. 6, S(10) is grounded (Gnd), D2(14) is connected to a power source (Vdd), and the gate electrode 18 is connected to an input (Input), so that D1(12) and D3(16) are opened (Open). Here, the gate electrode 18 (having a sign of a circle thereon) represents that the charge is stored in the ONO film 38 below the gate electrode 18. Other reference numerals are the same as those shown in FIG. 2.

Figure 7:
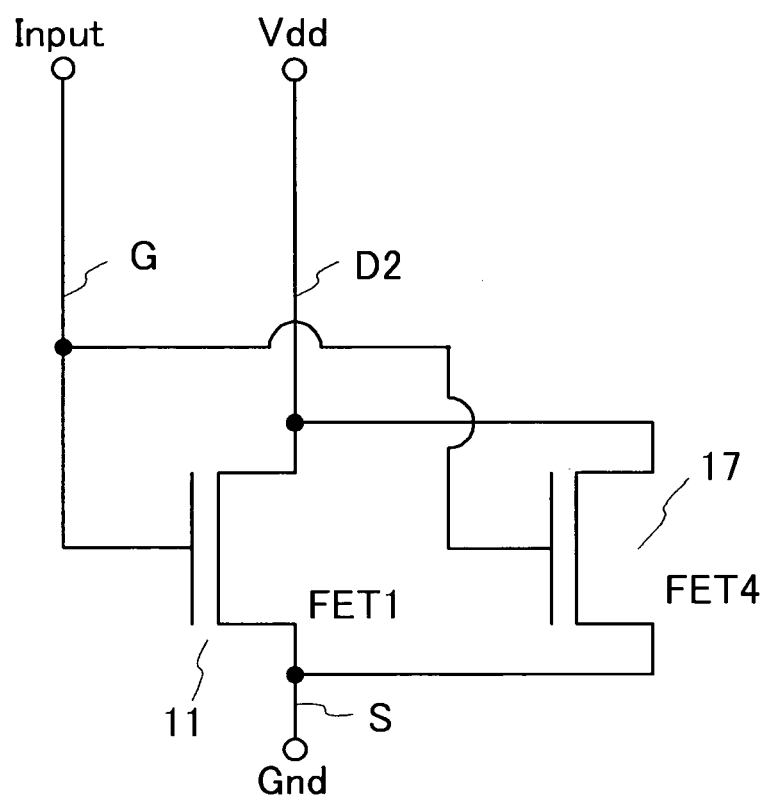
FIG. 7 is a circuit diagram illustrating the function when the OR circuit function has been programmed in the circuit in accordance with the first embodiment of the present invention.

FIG. 7 shows a circuit diagram as the voltages are applied in accordance with FIG. 6. S(10) common to FET1(11) and FET4(17) is grounded (Gnd), and the gate electrodes G1(18a) and G4(18d) of FET1(11) and FET4(17) are connected to an input (Input). The threshold voltage is controlled so that FET1 (11) and FET4(17) are turned off when the input is at a low level and turned on when the input is at a high level. The threshold voltage is also controlled so that FET2(13) and FET3(15) are turned on in both cases whether the input is at a low level and at a high level. Thus, FET2(13) and FET3(15) function as resistors regardless of the input level and are not shown in FIG. 7. Therefore, D1(12) in FET1(11) and D3(16) in FET4(17) are respectively coupled to an output from D2(14) via FET2(13) and FET3(15) that merely act as resistors. As described heretofore, FET1(11) and FET4(17) are connected in series, and this circuit functions as an OR circuit.

Figure 8:
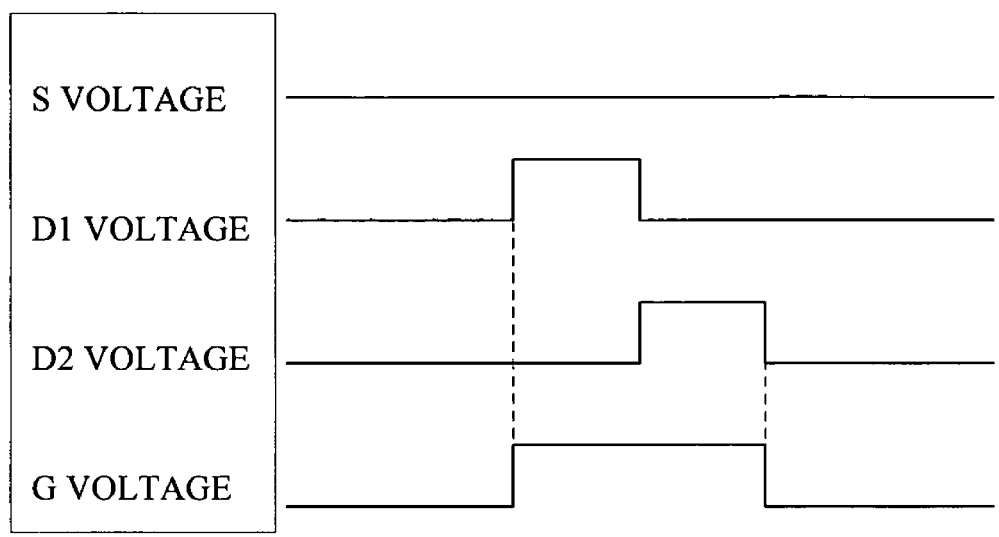
FIG. 8 is a timing chart of a case where an AND circuit function is to be programmed in the circuit in accordance with the first embodiment of the present invention.

Next, FIG. 8 is a timing chart showing a case where the function of an AND circuit is programmed. 5V, for example, is applied to D1(12), with S(10) grounded and 12 V, for example, applied to the gate electrode. Then, 5 V, for example, is applied to D2(14). Thus, the hot electrons in the channels below the gates G1(18a) and G2(18b) are stored in the ONO film 38 (the charge storage layer) below the gates G1(18a) and G2(18b) and the threshold voltages of FET1(11) and FET2(13) are increased. In the same manner, the ONO film (38) below the gates G3(18c) and G4(18d) stores the charge having an amount equal to or more than the charge amount stored in the ONO film below the gates G1(18a) and G2(18b). This increases the threshold voltages of FET3(15) and FET4(17) to be greater than those of FET1(11) and FET2 (13).

Alternatively, another method, to be described hereinafter, may be employed to achieve the above-mentioned function. First, the charge is stored in the ONO film 38 of FET1(11), FET2(13), FET3(15) and FET4(17) to increase the threshold voltage. S(10), D1(12), and D2(14) are grounded, and a negative voltage, for example, −12 V is applied to the gate electrode. This erases a portion of the charge stored in the ONO film of FET1(11) and FET2(13). Thus, the threshold voltages of FET1(11) and FET2(13) can be decreased to be smaller than those of FET3(15) and FET4(17).

Figure 9:
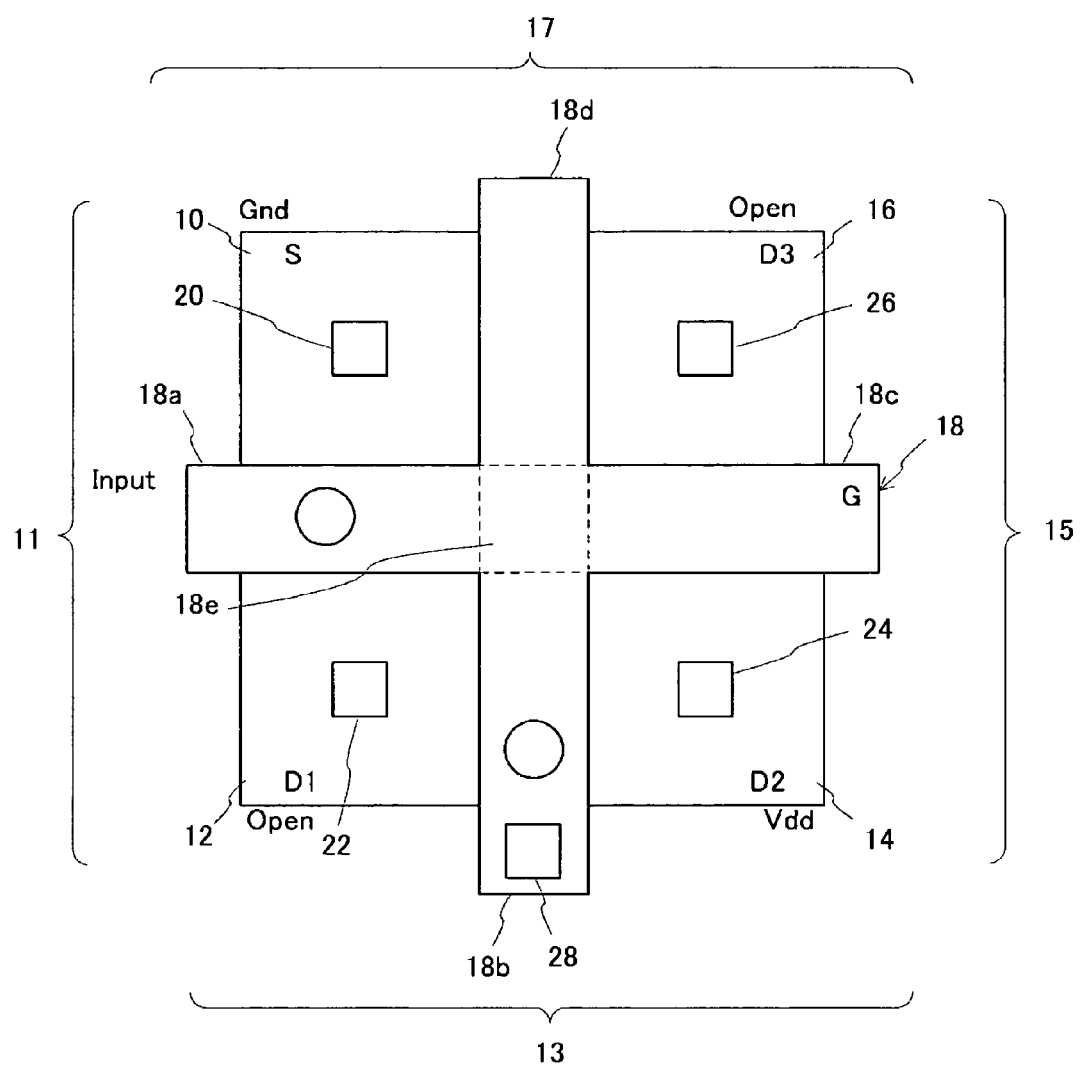
FIG. 9 is a top view illustrating the function when the AND circuit function is programmed in the circuit in accordance with the first embodiment of the present invention.

As shown in FIG. 9, S(10) is grounded (Gnd), the region D2 (14) is connected to the power source (Vdd), the gate electrode 18 is connected to the input (Input), and D1(12) and D3(16) are opened (Open). Here, as shown in FIG. 6, the gate electrode 18 having a sign of circle thereon represents that the charge is stored in the ONO film 38 below the gate electrode 18. Other reference numerals are the same as those shown in FIG. 2.

Figure 10:
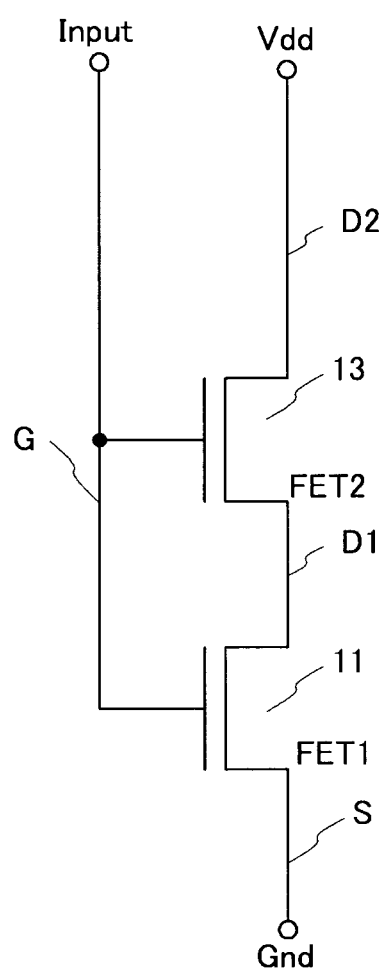
FIG. 10 is a circuit diagram illustrating the function when the AND circuit function has been programmed in the circuit in accordance with the first embodiment of the present invention.

FIG. 10 shows a circuit diagram as the voltages are applied in accordance with FIG. 9. S(10) is grounded (Gnd), FET1 (11) and FET2(13) are connected in series, and D2(14) is connected to the power source (Vdd). The gate electrodes G1(18a) and G2(18b) of FET1(11) and FET4(13) are coupled to the input (Input). The threshold voltage is controlled so that FET1(11) and FET2(13) are turned off when the input is at a low level and turned on when the input is at a high level. The threshold voltage is also controlled so that FET3(15) and FET4(17) are turned on in both cases where the input is at a low level and at a high level. This prevents the current from flowing through FET3(15) and FET4(17). Any one of FET3 (15) and FET4(17) may be turned off, yet it is possible to prevent the current to turn off both FET3(15) and FET4(17) as in the first embodiment. As described above, the AND circuit functions with FET1(11) and FET2(13) connected in series.

Figure 11:
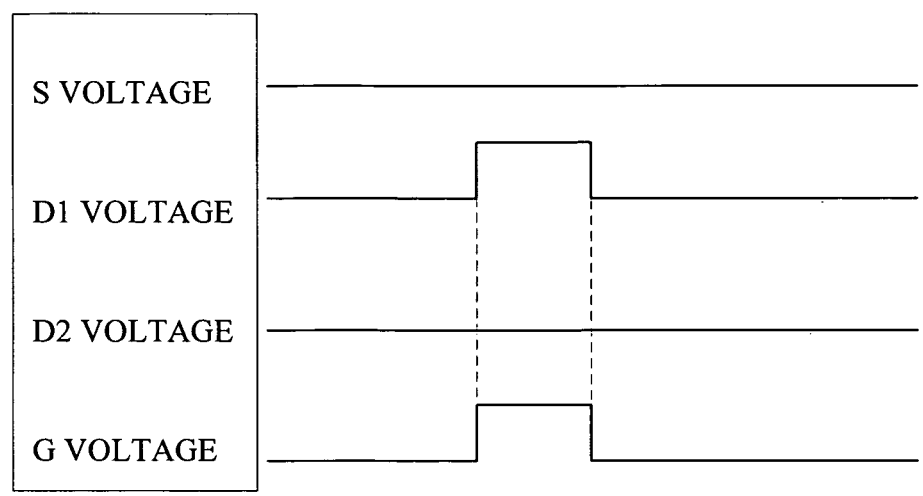
FIG. 11 is a timing chart of a case where an inverter circuit function is to be programmed in the circuit in accordance with the first embodiment of the present invention.

Next, FIG. 11 is a timing chart showing a case where the function of an inverter circuit is programmed. 10 V, for example, is applied to the regions D1, with S(10) grounded and 12 V, for example, applied to the gate electrode. Thus, the hot electrons in the channels below G1(18a) are stored in the ONO film 38 (charge storage layer) below G1(18a), and the threshold voltage of FET1(11) is increased. In the same manner, the charge, having an amount equal to or more than the charge amount stored in the ONO film below G1(18a) and G2(18b), is stored in the ONO film (38) below the G3(18c) and G4(18d). This increases the threshold voltages of FET3 (15) and FET4(17) to be greater than that of FET1(11).

Figure 12:
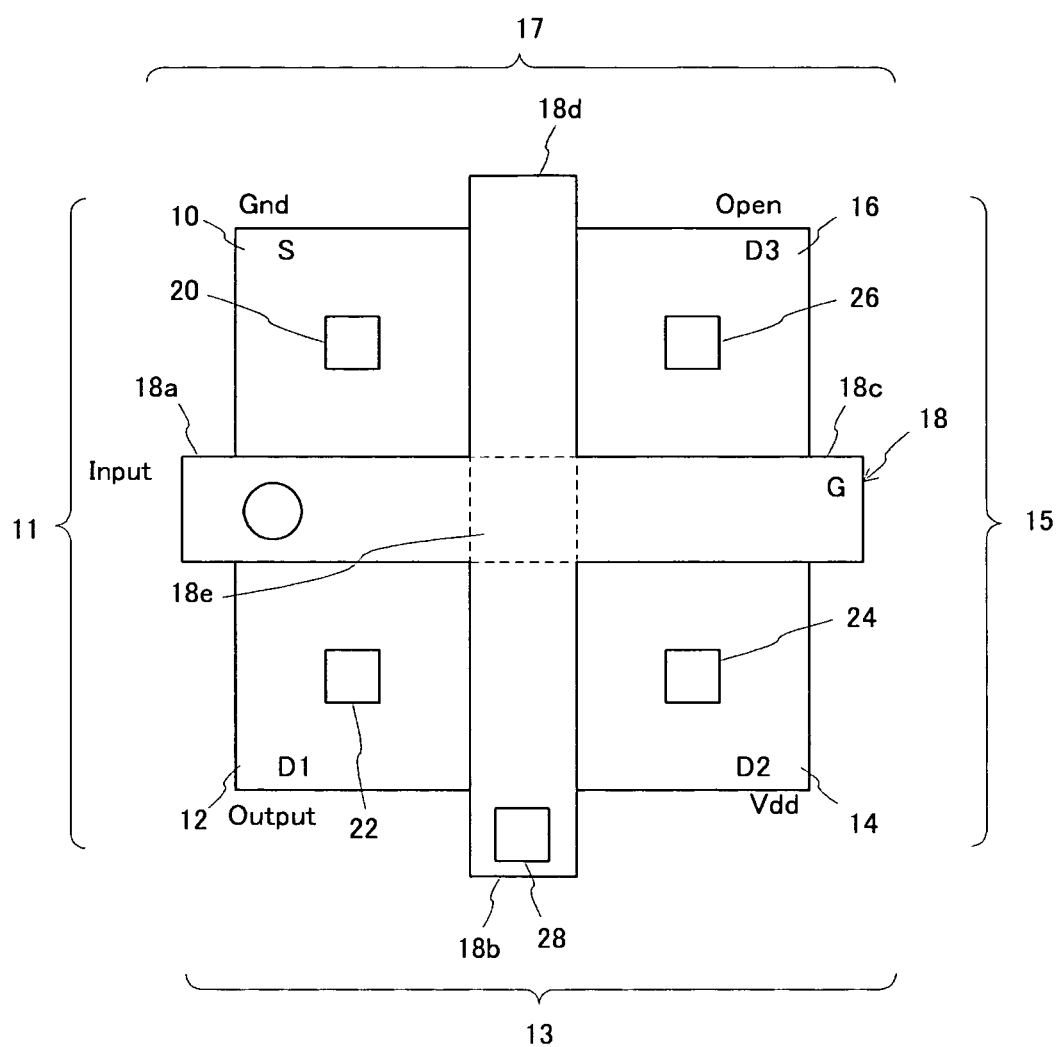
FIG. 12 is a top view illustrating the function when the inverter circuit function is programmed in the circuit in accordance with the first embodiment of the present invention.

Referring to FIG. 12, S(10) is grounded (Gnd), the region D1 (12) is connected to the power source (Vdd), the gate electrode 18 is connected to the input (Input), and D3(16) is opened (Open). Here, as shown in FIG. 6, the gate electrode 18 having a sign of a circle thereon represents that the charge is stored in the ONO film 38 below the gate electrode 18.

Figure 13:
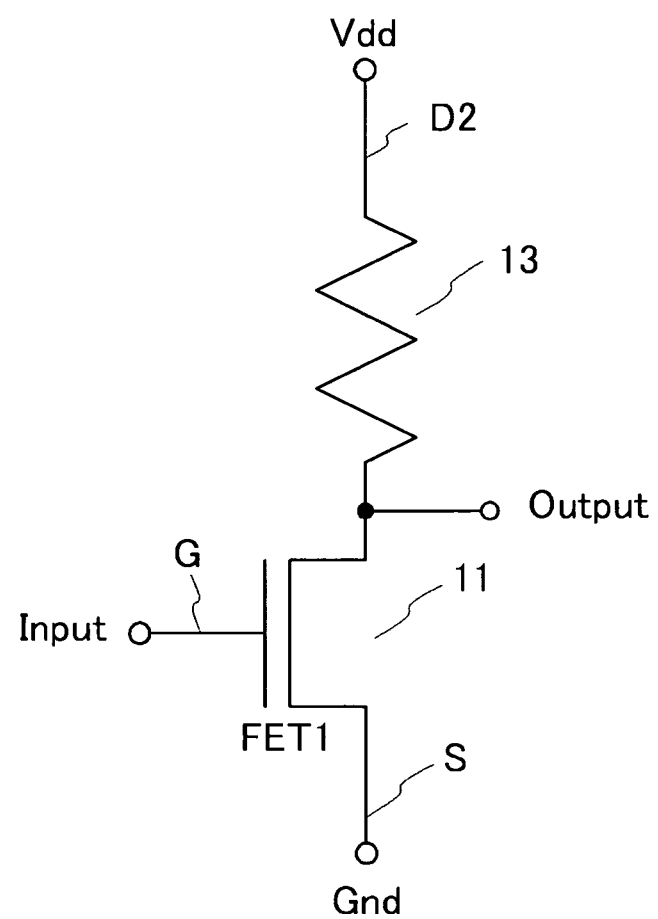
FIG. 13 is a circuit diagram illustrating the function when the inverter circuit function has been programmed in the circuit in accordance with the first embodiment of the present invention.

FIG. 13 is a circuit diagram as the voltages are applied in accordance with FIG. 12. S(10) is grounded (Gnd), FET1(11) and FET2(13) are connected in series, and D2(14) is connected to the power source (Vdd). The gate electrode G1(18a) of FET1(11) is connected to the input (Input). The threshold voltage is controlled so that FET1(11) is turned off when the input is at a low level and turned on when the input is at a high level. The threshold voltage is also controlled so that FET2 (13) is turned on in both cases where the input is at a low level and at a high level, thereby causing FET2(13) to function as a resistor. The threshold voltage is also controlled so that FET3 (15) and FET4(17) are turned off in both cases where the input is at a low level and at a high level. This prevents current from flowing through FET3(15) and FET4(17). Any one of FET3(15) and FET4(17) may be turned off, yet it is possible to more surely prevent the current if both are turned off as in accordance with the first embodiment of the present invention. Accordingly, this circuit serves as an inverter circuit in which the resistor and FET1(11) are connected in series.

The erase function of such programmed circuit may be performed by grounding S(10), D1(12), D2(14), and D3(16) and applying a negative voltage, for example −12V, to the gate electrode 18. Thus, the charge stored in the ONO film disappears due to Fowler-Nordheim (FN) tunneling current, and the erase function of the circuit is performed.

It is preferable that the current should not flow across the semiconductor substrate 30 below the connecting portion 18e of the gate electrode 18. Therefore, elements in the semiconductor substrate 30 below the connecting portion 18e may be separated by, for example, STI. In addition, the charge is stored in the ONO film 38 below the connecting portion 18e so that the current may not flow across the semiconductor substrate 30 below the connecting portion 18e in either case where the input into the gate electrode 18 is at a high level or at a low level. Alternatively, the connecting portion 18e is not provided and the gate electrodes 18a, 18b, 18c, and 18d may be connected with the use of an interconnection layer.

If the connecting portion 18e is not provided, the gate electrodes 18a and 18c may be connected and the gate electrodes 18b and 18d may be connected. In this case, the gate electrodes 18a and 18c and the gate electrodes 18b and 18d may be respectively connected to the input so that the OR circuit function and the AND circuit function can be realized with two inputs.

The first embodiment exemplifies the transistor (FET) in which the charge is stored in the ONO film, yet a transistor having a floating gate may be employed with the floating gate functions replacing the charge storage layer functions. Also, in this case, a non-volatile memory having a floating gate may be fabricated by the same fabrication process as that of the memory cell. The floating gate serving as the charge storage layer in this case may be used as the charge storage layer in the non-volatile memory with the same configuration.

As described above, in a memory cell in accordance with the first embodiment it is possible to reconfigure the circuit function in a non-volatile manner by storing charge in the ONO film serving as the charge storage layer and changing the threshold voltage of the transistor. In addition, the circuit has the reconfiguration function of the circuit itself and the memory cell that acts as a basic block is located repeatedly, making it possible to provide a logic circuit with wide selectivity and excellent design efficiency in terms of circuit design. Furthermore, this circuit is fabricated in the same fabrication process as the non-volatile memory shown in Patent Document 1, thereby advantageously enabling the circuit to be fabricated on the same chip as the non-volatile memory.

Second Embodiment

Figure 14:
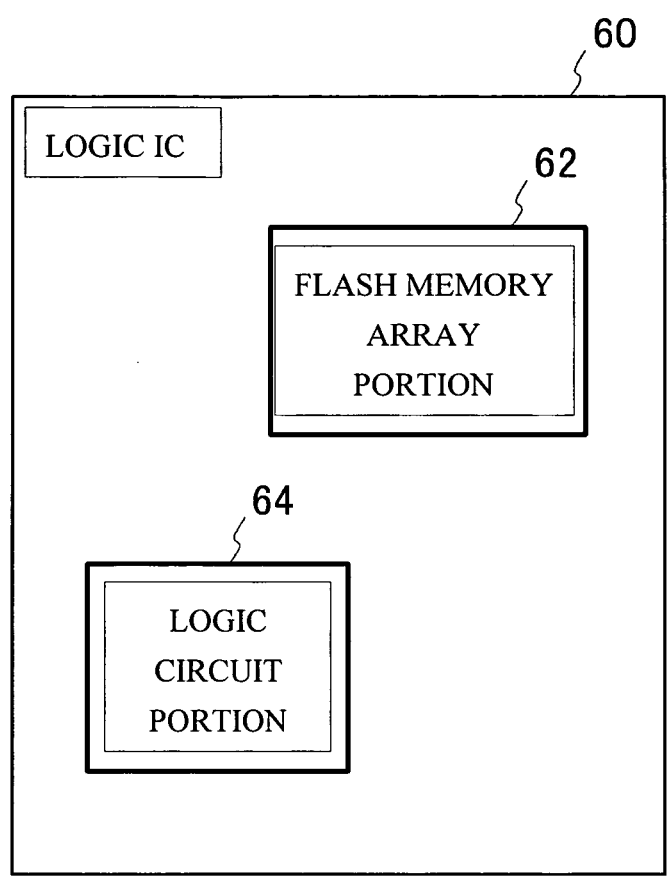
FIG. 14 is a block diagram showing a logic IC in accordance with a second embodiment of the present invention.

A second embodiment exemplifies a logic IC. FIG. 14 schematically shows the second embodiment. A logic IC 60 includes a memory cell in accordance with the first embodiment (i.e., a memory cell in which the circuit function can be reconfigured in a non-volatile manner by storing charge in the charge storage layer). A logic circuit portion 64 and a memory array portion 62 are fabricated on a single chip. In the logic circuit portion 64, the memory cell in accordance with the first embodiment, serving as a basic block, is repeatedly located. The memory array portion 62 includes a non-volatile memory such as that described in, for example, Patent Document 1. The ONO film is utilized as the charge storage layer by the circuit in which the circuit function is reconfigurable in a non-volatile manner and by the non-volatile memory. In this manner, the memory cell in the logic circuit portion 64 and the non-volatile memory in the memory array portion 62 substantially include the charge storage layer having the same configuration. Accordingly, the logic circuit portion 64 and the memory array portion 62 can be fabricated by almost the same fabrication process, thereby making it possible to readily fabricate both simultaneously on the same chip.

A floating gate may be provided below the gate electrode to utilize the floating gate as the charge storage layer for both the circuit in which the circuit function is reconfigurable in a non-volatile manner and the non-volatile memory. Also, in this case, the memory cell in the logic circuit portion 64 and the non-volatile memory in the memory array include the charge storage layer having substantially the same configuration. Therefore, the logic circuit portion 64 and the memory array portion 62 can be fabricated by approximately the same fabrication process. As described above, to substantially include the charge storage layer having the same configuration in both the logic circuit portion 64 and the memory array portion 62, denotes that both charge storage layers are composed of the same materials, thereby making it possible to fabricate both the logic circuit portion 64 and the memory array portion 62 by approximately the same fabrication process readily on the same chip.

Although a few preferred embodiments of the present invention have been shown and described, it would be appreciated by those skilled in the art that changes may be made in these embodiments without departing from the principles and spirit of the invention, the scope of which is defined in the claims and their equivalents. For example, the embodiments exemplify a digital circuit, yet the present invention is equally applicable to an analog circuit.

What is claimed is:

1. A semiconductor device comprising:
a circuit comprising transistors, including at least a first transistor, a second transistor, and a third transistor, wherein each of the transistors includes:
a gate electrode formed above a semiconductor substrate;
source/drain regions formed in the semiconductor substrate below and on both sides of the gate electrode; and
a charge storage layer formed on and in direct contact with an upper surface of the semiconductor substrate and interposed between the gate electrode and the semiconductor substrate,
wherein the source/drain regions of the transistors are connected in series so as to form a closed loop, wherein the source/drain regions in adjoining transistors are respectively connected to form the closed loop, wherein the first transistor shares one of the source/drain regions with the second transistor, and the second transistor shares another one of the source/drain regions with the third transistor, and wherein a reconfigurable logical function of the circuit is selected by controlling an amount of charge stored in the charge storage layer of each of the transistors, and wherein the circuit can be configured as a non-volatile memory cell.

2. The semiconductor device as claimed in claim 1, wherein the number of the transistors is equal to or more than four.

3. The semiconductor device as claimed in claim 1, wherein the gate electrodes of the transistors are connected together.

4. The semiconductor device as claimed in claim 1, wherein the charge storage layer of the transistors is an ONO film.

5. A semiconductor device comprising:
a plurality of non-volatile memory cells; and
a logic circuit including at least one reconfigurable circuit, wherein the at least one reconfigurable circuit comprises transistors, including at least a first transistor, a second transistor, and a third transistor, wherein each of the transistors of the at least one reconfigurable circuit comprises:
a gate electrode formed above a semiconductor substrate;
source/drain regions formed in a semiconductor substrate below and on both sides of the gate electrode; and
a charge storage layer formed on and in direct contact with an upper surface of the semiconductor substrate and interposed between the gate electrode and the semiconductor substrate, and wherein the source/drain regions of the transistors are connected in series to form a closed loop, and wherein the source/drain regions in adjoining transistors are respectively connected to form the closed loop, and wherein the first transistor shares one of the source/drain regions with the second transistor, and the second transistor shares another one of the source/drain regions with the third transistor, and wherein the at least one reconfigurable circuit has a logical function that can be reconfigured in a non-volatile manner by varying the threshold voltage of one or more of the transistors, wherein the threshold voltage is varied by controlling an amount of charge stored in the charge storage layer of the one or more of the transistors, and wherein the plurality of non-volatile memory cells each includes a charge storage layer that is substantially the same as the charge storage layer of each of the transistors of the reconfigurable circuits.

6. The semiconductor device as claimed in claim 1 wherein the circuit is selected from a group of logic circuits consisting of an AND circuit, an OR circuit, an inverter circuit, a NAND circuit, and a NOR circuit.

7. The semiconductor device as claimed in claim 6 wherein the circuit is defined by the logical function performed by the transistors thereof.

8. The semiconductor device as claimed in claim 5 wherein the at least one reconfigurable circuit is selected from a group of circuits consisting of an AND circuit, an OR circuit, an inverter circuit, a NAND circuit, and a NOR circuit.

9. The semiconductor device as claimed in claim 5, wherein the charge storage layers of the plurality of non-volatile memory cells and the charge storage layers of the transistors of the at least one reconfigurable circuit are ONO films.

10. The semiconductor device as claimed in claim 8 wherein the at least one reconfigurable circuit is defined by the logical function performed by the transistors thereof.

11. The semiconductor device as claimed in claim 5, wherein the number of the transistors is equal to or more than four.

12. The semiconductor device as claimed in claim 5, wherein the gate electrodes of the transistors are connected together.

* * * * *